United States Patent [19]
Lopez et al.

[11] Patent Number: 5,410,319
[45] Date of Patent: Apr. 25, 1995

[54] NEAR FIELD ANTENNA MEASUREMENT SYSTEMS AND METHODS

[75] Inventors: Alfred R. Lopez; Paul H. Feldman, both of Commack; Joseph B. Gencorelli, Lindenhurst; Gary Schay, Stony Brook, all of N.Y.

[73] Assignee: Hazeltine Corporation, Greenlawn, N.Y.

[21] Appl. No.: 125,381

[22] Filed: Sep. 22, 1993

Related U.S. Application Data

[60] Division of Ser. No. 958,607, Oct. 8, 1992, Pat. No. 5,270,723, which is a continuation of Ser. No. 591,698, Oct. 2, 1990, abandoned, which is a continuation-in-part of Ser. No. 339,560, Apr. 13, 1989, abandoned.

[51] Int. Cl.$^6$ .............................................. H01Q 3/00
[52] U.S. Cl. ..................................... 342/360; 342/173
[58] Field of Search ........................ 342/360, 351, 173; 343/703

[56] References Cited

U.S. PATENT DOCUMENTS

| | | | |
|---|---|---|---|
| 4,453,164 | 6/1984 | Patton | 342/360 |
| 4,553,145 | 11/1985 | Evans | 342/360 |
| 4,926,186 | 5/1990 | Kelly et al. | 342/360 |

Primary Examiner—Theodore M. Blum
Attorney, Agent, or Firm—E. A. Onders; K. P. Robinson

[57] ABSTRACT

A field monitor in the near field receives an antenna signal which approximates that which would be received by the monitor if located in the far field. In one aspect of the invention, the antenna signal is produced by an array of spaced apart receiving elements. In another aspect of the invention, the signal received from a near field sampling antenna is passed through a signal processor having the necessary characteristics to construct from the sample a signal corresponding to that which would have been received in the far field. Antenna element arrays are also used as plane wave sources permitting antenna testing with a radiating path length of one-eighth or one-quarter of the far field distance. Compact indoor antenna test ranges are also provided.

18 Claims, 4 Drawing Sheets

NEAR FIELD ANTENNA MEASUREMENT SYSTEMS AND METHODS

"This is a division of application Ser. No. 07/958,607, filed Oct. 8, 1992, now U.S. Pat. No. 5,270,723, which is a continuation of Ser. No. 07/591,698, filed Oct. 2, 1990, now abandoned, which was a continuation in part of Ser. No. 07/339,560, filed on Apr. 13, 1989, now abandoned."

BACKGROUND OF THE INVENTION

This invention relates to near field antenna measurement systems generally and, more particularly, to novel systems and methods which allow a monitor in the near field to receive a signal approximating that which the monitor would receive if located in the far field.

While the present invention is described as being especially useful with near field antenna monitors for microwave landing systems (MLS) for aircraft, it will be understood by those skilled in the art that it has other useful applications as well.

Part of a typical MLS is concerned with angle guidance for aircraft, which is accomplished through the use of two electronically scanned microwave antenna arrays - one for azimuth and the other for elevation. Distance is measured by a third element not of concern here. Because of the criticality of the application, each antenna is continuously monitored in the field in real time to measure the quality of the microwave beam. Ideally, the beam should be monitored in the far field where it is focused, that is, a distance from the antenna of at least $2D^2/\lambda$, wherein D=aperture of the transmitting device and $\lambda$=wavelength of the transmitted signal, all in feet. For a 1 degree beam width antenna, this distance is approximately 1400 feet.

In many cases, it is impractical to locate monitors in the far field; however, locating the monitor in the near field where the transmitted beam is unfocused can result in unacceptable performance, primarily due to phase errors and due to the magnification of the effects of system design tolerances. While somewhat acceptable results can be obtained with monitors located about 300 feet from the antenna, there is considerable room for improvement. Also, in some cases, even that distance is impractical and it would be desirable to be able to locate the monitor closer, say, perhaps as close as 80–90 feet and still be able to obtain acceptable results.

It is, therefore, an object of the present invention to provide a method and means for locating an antenna monitor in the near field relatively close to the antenna while obtaining acceptable monitoring.

It is an additional object of the invention to provide such means that may comprise only passive components, for reliability.

It is another object of the invention to provide such method and means that can be easily and simply applied without consuming a great deal of space.

SUMMARY OF THE INVENTION

The present invention achieves the above objects, among others, by providing to a field monitor in the near field an antenna signal which approximates that which would be received by the monitor if located in the far field. In one aspect of the invention, the antenna signal is produced by an array of spaced apart receiving elements, the combined signal from such elements approximating the signal that would be received from a monitoring antenna located in the far field. In another aspect of the invention, the signal received from a near field sampling antenna is passed through a signal processor having the necessary characteristics to construct from the sample a signal corresponding to that which would have been received in the far field. In either case, the resulting signal is then the input to the monitor.

For a better understanding of the invention together with other and further objects, reference is made to the following description, taken in conjunction with the accompanying drawings, and its scope will be pointed out in the appended claims.

DETAILED DESCRIPTION OF THE INVENTION

Figure 1:
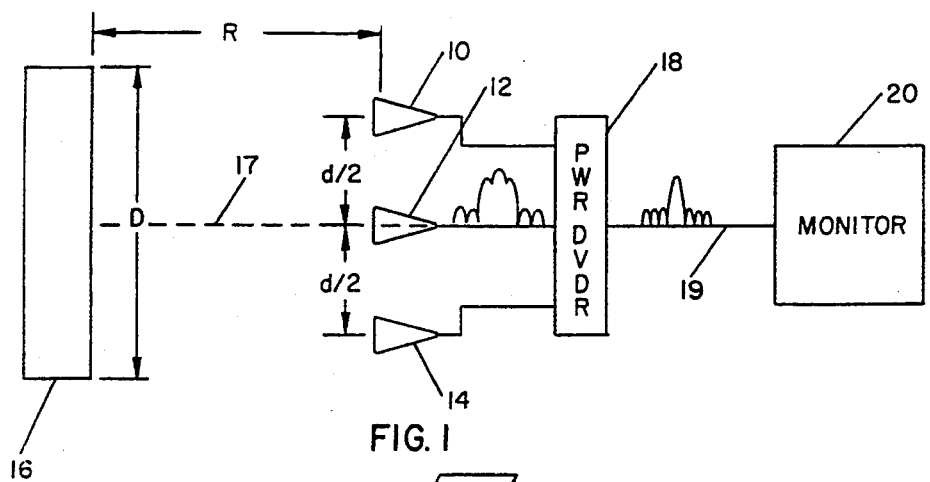
FIG. 1 is a schematic diagram of a field monitor system employing a sampling array according to a first embodiment of the present invention.

FIG. 1 shows a schematic diagram of an antenna measurement system in the form of a monitor system employing a first type of sampling array according to the present invention which may be assumed to be located in the near field and which includes antenna means shown as three, equally spaced conventional antenna elements 10, 12 and 14 disposed in a line parallel to the major axis of an antenna 16 which is being monitored, with the center element aligned with the center of the transmitting antenna as indicated by reference axis 17. When antenna 16 is an elevation antenna, it may be assumed that FIG. 1 is an elevation view. When antenna 16 is an azimuth antenna, it may be assumed that FIG. 1 is a plan view. It will be understood that both elevation and azimuth antennas would be provided in a monitoring installation.

The FIG. 1 system also includes signal translation means, including power divider 18 and the transmission lines coupling divider 18 to the antenna elements 10, 12 and 14. As illustrated, the signal translation means is coupled between the antenna elements and coupling means, shown as transmission line section 19 which connects to monitor 20. The signals received by antenna elements 10–14 are combined in power divider 18 of the type that is used with transmitting antennas, it being understood that elements of transmitting/receiving systems have reciprocal functions. Power divider 18 causes the off-axis signals from antenna elements 10 and 14 to be one half amplitude and lag that from antenna element 12 by 120 degrees, assuming the signal from on-axis antenna element 12 is at zero phase. The combined signal from power divider 18 is passed to monitor 20 which "sees" a signal approximating that which it would receive if the system were located in the far field.

As seen in FIG. 1, antenna elements 10 and 14 are spaced apart from antenna element 12 by a distance d/2. It has been found that acceptable results can be obtained with the embodiment shown when $d=(\frac{2}{3})(\lambda/\sin\theta)$ and $R=D^2/3\lambda$), wherein $\lambda$=wavelength of the transmitted signal, R is the distance between the transmitting antenna 16 and antenna element 12, and $\theta$=the angle formed between the center and the edge of the transmitting antenna 16 as viewed from antenna element 12. Where $\theta$=arctan (D/2R), it follows that d=4D/9. When for example, the transmitting antenna aperture D is 12 ft. and the wavelength of the signal is 2333 inches, d—64 inches and R=246.9 feet. As noted above, acceptable results are obtained with three antenna elements; however, additional elements to improve the quality of the signal produced can be provided within the intent of the present invention by those skilled in the art.

While the present invention may be practiced, as described above, with three separate antenna elements feeding a power divider, it is preferable to use an antenna array which may employ a standing wave, but with which a power divider cannot cause the necessary phase shift. Antenna arrays employing standing waves are shown in perspective view in FIGS. 2 and 3 wherein antennas are illustrated for azimuth and elevation arrays, respectively, and wherein like elements are given like identifying reference numerals in both figures.

Each antenna array, generally indicated by the reference numeral 26 or 28, includes a rectangular waveguide 30, flare elements, as at 32, closed cell foam blocks for weather protection, as at 34, and adjustable short circuit blocks 6 at each end of waveguide 30 for obtaining optimum performance. A coaxial cable 37 attached to the broad side of waveguide 30 connects the array to the monitor (not shown).

Azimuth antenna array 26 (FIG. 2) includes three elements 38, 40, 42 formed as shown, with elements 38, 40 and 42 with each element having seven or less radiating slots, all slots being formed in a broad side of waveguide 30. Elevation antenna array 28 (FIG. 3) includes three elements 46, 48 and 50 formed as shown, with each element having six or less radiating slots formed in a narrow side of waveguide 30. With both arrays 26 and 28, the outermost elements are spaced apart from the center element by a distance d/2 determined by the formula discussed above with reference to the arrangement shown in FIG. 1, i.e., $d=(\frac{2}{3})(\lambda/\sin\theta)$. In this embodiment the waveguide 30 comprises signal translation means coupling the antenna elements 38, 40 and 42 to the transmission line section 37 for coupling signals to a monitor.

Figure 2:
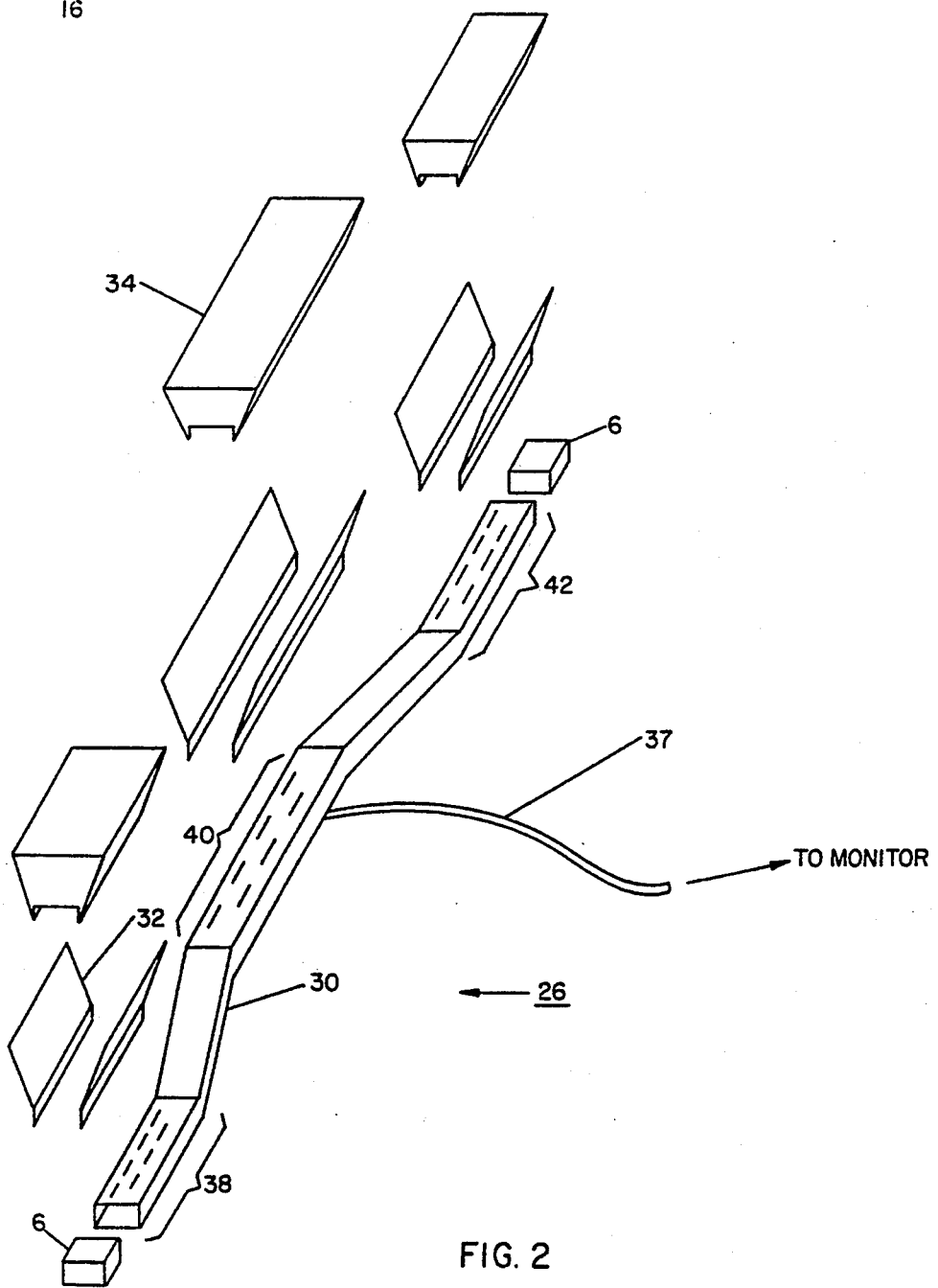
FIG. 2 is a perspective view of an azimuth focusing array according to a second embodiment of the present invention.
Figure 3:
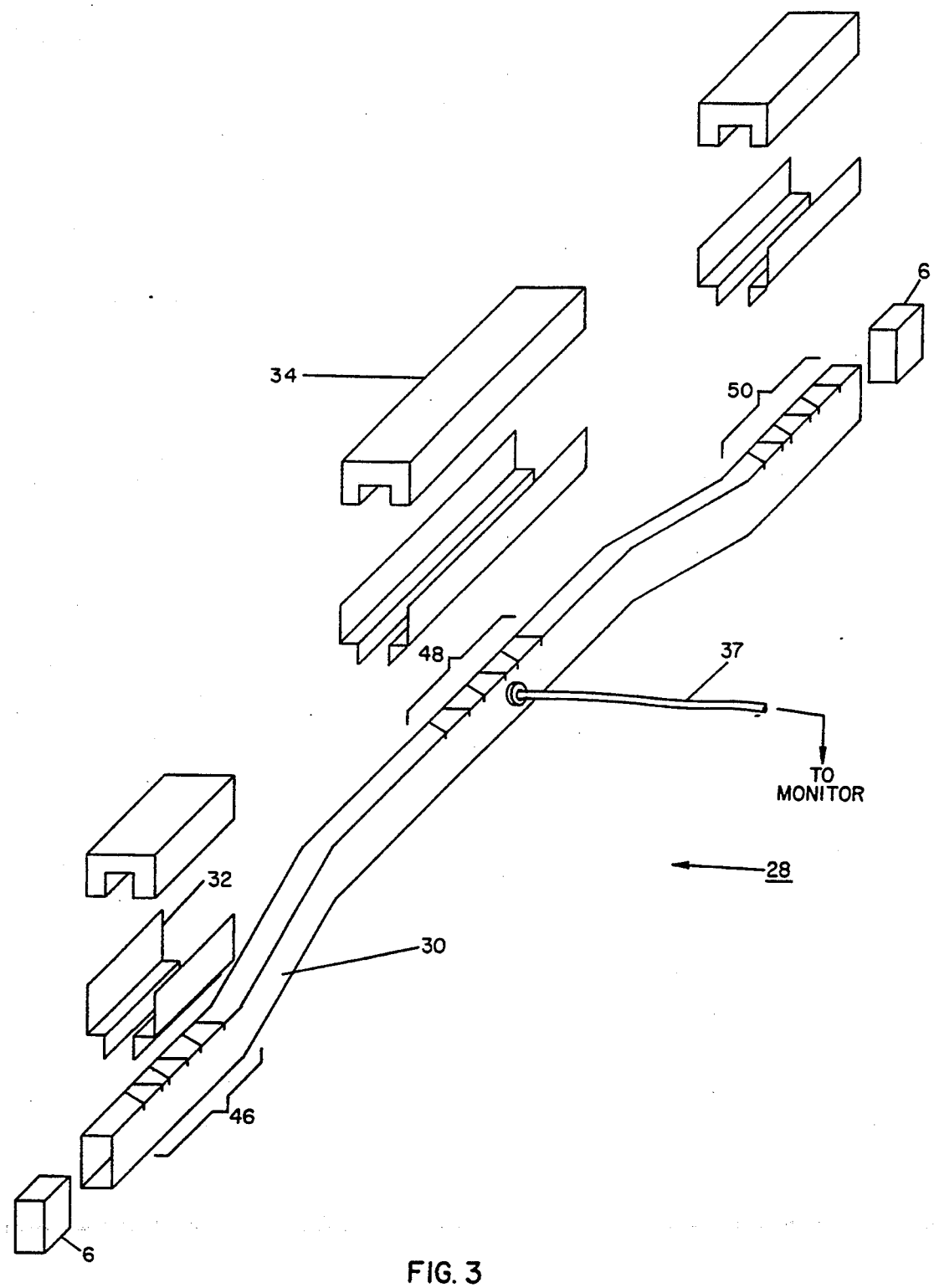
FIG. 3 is a perspective view of an elevation focusing array according to a second embodiment of the present invention.

As can be seen from inspection of FIGS. 2 and 3, the outermost elements are offset in a greater degree from the transmitting antenna (not shown) than the center elements by bends in the waveguides 30 to provide phase lag which cannot be attained using a power divider with a standing wave antenna. A standing wave antenna is preferred, as it provides for a high degree of phase stability. It has been found, that with the configuration shown, the offset is preferably chosen so that, when the center element is at zero phase, the outer elements each lag in phase by 105 degrees. The necessary offset to provide this phase lag is 0.68 inches.

As noted above, blocks 34 are closed cell foam. The other elements of antenna arrays 26 and 28 are preferably and conveniently formed from aluminum sheet.

Figure 4:
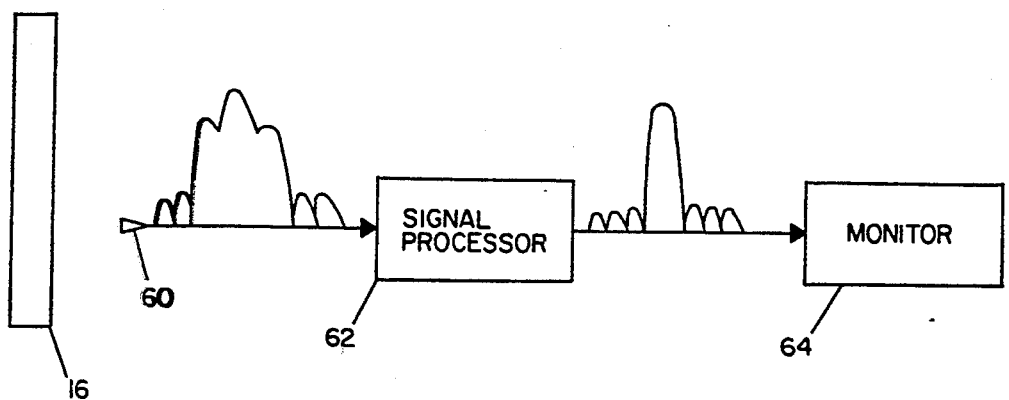
FIG. 4 is a schematic diagram of a field monitor system according to a third embodiment of the present invention.

FIG. 4 shows schematically another embodiment of the present invention, this one electronically "focusing" the signal received in the near field. Here, a beam from transmitting antenna 16 is received by monitoring antenna 60 which may be of any conventional type. As with reference to the discussion above in connection with FIG. 1, antenna 16 may be viewed as either an azimuth or elevation antenna. Monitoring antenna 60 passes the received unfocused signal pattern to a signal processor 62 which provides as its output a focused signal pattern as would be received by a monitoring antenna located in the far field, which focused signal pattern is the input to monitor 64.

Figure 5:
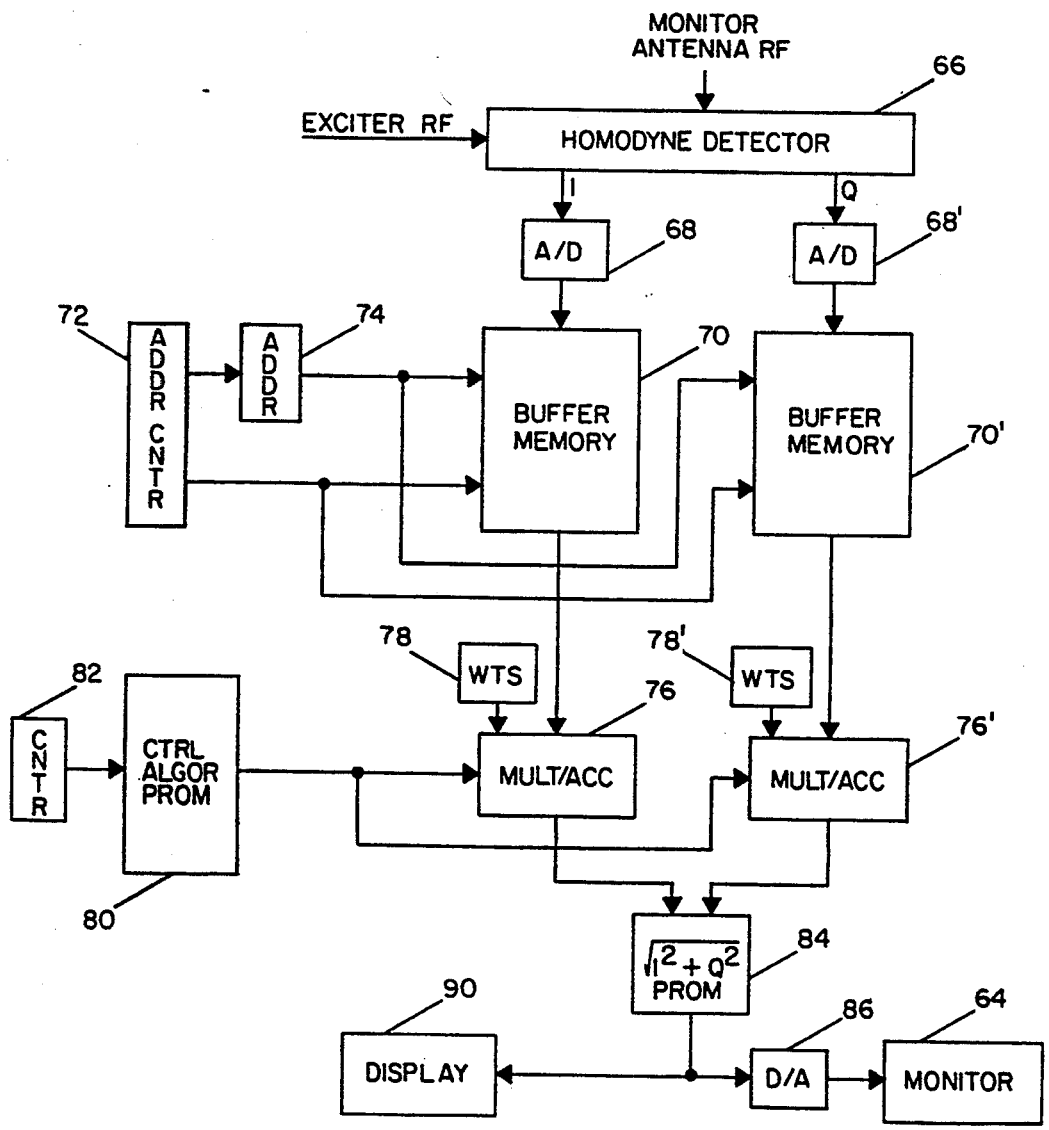
FIG. 5 is a block flow diagram illustrating the operation of the signal processor of the embodiment of FIG. 4.

FIG. 5 is a block flow diagram of signal processor 62 of FIG. 4 which receives the unfocused antenna signal and produces a signal approximating a focused signal. A homodyne detector 66 receives as inputs the monitor antenna RF signal and the exciter RF signal from the transmission system. The in-phase ("I") and quadrature ("Q")outputs of homodyne detector 66 are converted to digital signals by analog/digital converters 68 and 68' respectively, which produce bits of sample information approximately every 2 microseconds. The data bits from A/D converters 68 and 68' are stored in buffer memories 70 and 70', respectively, which may be 1K×8 RAMs. An adder/counter 72 and an adder 74 serve as a circular counter to sequentially address the data bits in buffer memories 70 and 70' and pass the data to multiplier/accumulators 76 and 76', respectively, where, in moving groups, they are sequentially multiplied by sets of weights 78 and 78', respectively, under an algorithm stored in a PROM 80 and initiated by a counter 82. The outputs from multiplier/accumulators 76 and 76' pass to a PROM 84 where they are combined in the function shown. The output of PROM 84 passes to a digital-/analog converter 86 and thence to monitor 64. If desired, the digital output of PROM 84 may be fed to a digital display 90.

Figure 6:
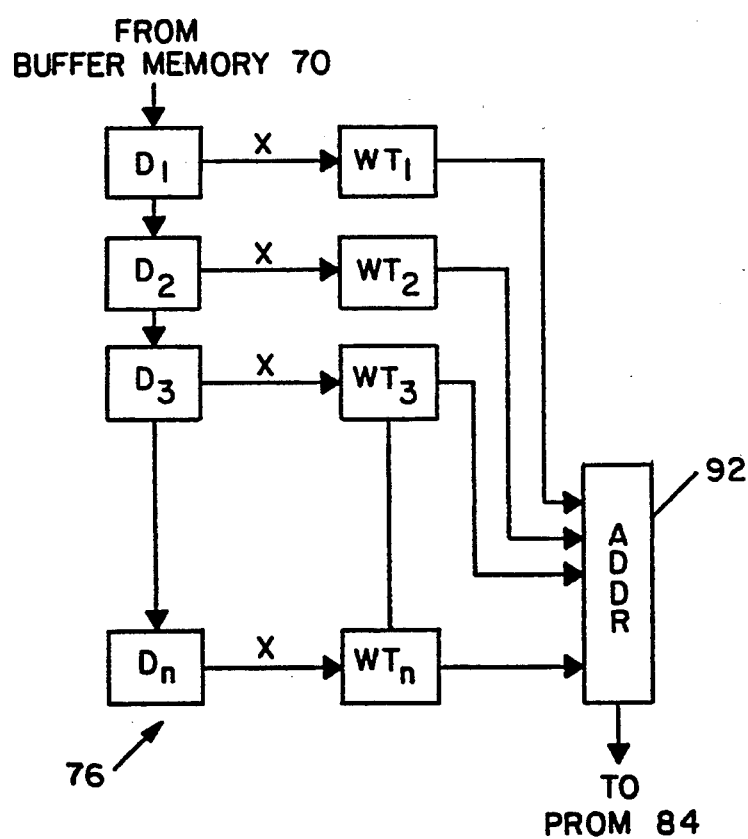
FIG. 6 is a block flow diagram illustrating the operation of an element of the signal processor of FIG. 5.

FIG. 6 diagrammatically illustrates the function of multiplier/accumulators 76 and 76' in which a moving stream of data bits from a buffer memory, in this case buffer memory 70, for example, enters multiplier/accumulator 76 and is multiplied by weighting factors, with the products summed in adder 92 and inputted to PROM 84. The weighting factors are chosen such that the final analog signal to monitor 64 (FIG. 5) will approximate that which it would receive in the far field.

With the embodiment of the present invention shown on FIGS. 4-6, one should be able to obtain satisfactory results with a monitor installation in the near field at least as close to the transmitting antenna as 80-90 feet and possibly as close as 60 feet. Monitoring antenna locations closer than 60 feet would probably not be satisfactory, as the processing time of about 250-400 microseconds would become a significant part of the response time of the monitor. At farther distances, the processing time is small compared to the response time and the effect thereof is less significant.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

We claim:

1. An antenna measurement system, for use in the near field of a scanned beam antenna, comprising:
   antenna means for coupling signals from a near field position spaced from said scanned beam antenna by a distance of at least a plurality of aperture widths of said scanned beam antenna; and
   a signal processor including:
   quadrature signal means, coupled to said antenna means, for providing quadrature components representative of the near field pattern of said scanned beam antenna;
   storage means, coupled to said quadrature signal means, for storing samples of said quadrature components selected at predetermined times;
   weighting factor means for providing a sequence of weighting factors;
   processing means, coupled to said storage means, for processing said samples of said quadrature components using said weighting factors, to provide modified quadrature component samples; and
   combining means, coupled to said processing means, for combining said modified quadrature signal samples by application of a square root of the sum of the squares function to provide a composite signal representative of the far field pattern of said scanned beam antenna.

2. An antenna measurement system as in claim 1, wherein said quadrature signal means comprises means for providing an in-phase real component, I, and a quadrature phase imaginary component, Q, representative of said near field pattern of the scanned beam antenna.

3. An antenna measurement system as in claim 2, additionally comprising first and second analog-to-digital converters for respectively converting said I and Q components from analog to digital form.

4. An antenna measurement system as in claim 3, wherein said first and second analog-to-digital converters are arranged to respectively provide digital data bit samples of said I and Q components at predetermined uniform intervals of time.

5. An antenna measurement system as in claim 3, wherein said scanned beam antenna is a phased array MLS antenna and said storage means is arranged for storing samples of said I and Q components, which are provided at two microsecond intervals by said first and second analog-to-digital converters.

6. An antenna measurement system as in claim 1, wherein said quadrature signal means comprises a homodyne detector.

7. An antenna measurement system as in claim 1, wherein said storage means is arranged for storing data bit samples of said quadrature components selected at predetermined uniform intervals of time.

8. An antenna measurement system as in claim 7, additionally comprising counter means, coupled to said storage means, for causing said data bit samples to be sequentially coupled to said processing means for multiplication by said sequence of weighting factors.

9. An antenna measurement system as in claim 1, wherein said processing means comprise first and second multiplier/accumulators in which said sequence of weighting factors, including at least two sets of weighting factors representative of desired far field corrections, are sequentially applied in parallel relationship to said quadrature components of the near field pattern of said scanned beam antenna to provide said modified quadrature component samples.

10. An antenna measurement system as in claim 9, wherein said quadrature signal means provides I and Q components and said first and second multiplier/accumulators are arranged to utilize only first and second sets of weighting factors, which are applied sequentially to said I and Q components, respectively, in separated parallel relationship.

11. An antenna measurement system as in claim 9, additionally comprising means, coupled to said first and second multiplier/accumulators, for storing an algorithm utilized for controlling operation of said first and second multiplier/accumulators of said processing means.

12. An antenna measurement system as in claim 9, wherein said quadrature signal means provides I and Q components and said combining means is arranged to square the values of modified I and Q components after respective multiplication and summation thereof, and to determine the square root of the sum of said squared values.

13. An antenna measurement system as in claim 1, additionally comprising a monitor coupled to said combining means of said signal processor.

14. A method for measuring the antenna pattern of a scanned beam antenna, using a monitor antenna located in the near field, comprising the steps of:
   (a) positioning said monitor antenna in the near field spaced at least a plurality of aperture widths from said scanned beam antenna;
   (b) deriving quadrature components representative of the near field pattern of said scanned beam antenna, by use of near field signals received by said monitor antenna;
   (c) storing samples of said quadrature components selected at predetermined time intervals;
   (d) processing said samples of said quadrature components by use of weighting factors to provide modified quadrature component samples; and
   (e) combining said modified quadrature component samples by use of a square root of the sum of the squares function to provide a composite signal representative of the far field pattern of said scanned beam antenna.

15. A method as in claim 14, wherein step (b) comprises deriving said quadrature components as parallel series of I and Q components.

16. A method as in claim 15, wherein step (c) comprises storing samples of said I and Q components which are selected at predetermined uniform time intervals.

17. A method as in claim 15, wherein step (d) comprises multiplying said I components by a first set of said weighting factors and, in parallel, multiplying said Q components by a second set of said weighting factors, and separately summing the resulting modified I components and modified Q components.

18. A method as in claim 17, wherein step (e) comprises separately squaring the summed modified I components and the summed modified Q components provided in step (d), totalling the results of such squaring and taking the square root of said total.

* * * * *